(12) United States Patent
Lee et al.

(10) Patent No.: US 11,184,779 B2
(45) Date of Patent: Nov. 23, 2021

(54) ELECTRONIC DEVICE FOR CONTROLLING BEAM WIDTH AND METHOD THEREOF

(71) Applicant: Samsung Electronics Co., Ltd., Gyeonggi-do (KR)

(72) Inventors: Youngpo Lee, Gyeonggi-do (KR); Taeyoon Kim, Gyeonggi-do (KR); Chaiman Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/543,890

(22) Filed: Aug. 19, 2019

(65) Prior Publication Data

US 2020/0068415 A1 Feb. 27, 2020

(30) Foreign Application Priority Data

Aug. 27, 2018 (KR) .......................... 10-2018-0100411

(51) Int. Cl.
*H04W 16/28* (2009.01)
*H04W 4/02* (2018.01)
(Continued)

(52) U.S. Cl.
CPC ............ *H04W 16/28* (2013.01); *H03F 3/193* (2013.01); *H03G 3/3068* (2013.01);
(Continued)

(58) Field of Classification Search
None
See application file for complete search history.

(56) References Cited

U.S. PATENT DOCUMENTS

2004/0053634 A1* 3/2004 Gainey ................ H01Q 3/2641
455/522
2006/0284783 A1* 12/2006 Mohamadi ........... H01Q 21/065
343/853
(Continued)

FOREIGN PATENT DOCUMENTS

EP 3 293 897 A1 3/2018
KR 10-2012-0072938 A 7/2012
(Continued)

OTHER PUBLICATIONS

International Search Report dated Nov. 27, 2019.
(Continued)

*Primary Examiner* — San Htun
(74) *Attorney, Agent, or Firm* — Cha & Reiter, LLC

(57) ABSTRACT

An electronic device comprises a first communication circuit configured to transmit at least one radio frequency (RF) signal, at least one antenna structure, electrically coupled to the first communication circuit, and including a plurality of antenna elements, at least one processor operatively coupled to the first communication circuit, and memory operatively coupled to the at least one processor. The memory stores instructions that, when executed by the at least one processor, causes the processor to perform a plurality of operation. The plurality of operations comprises identifying mobility information of the electronic device, identifying a beam width of a beam formed by at least a part of the plurality of antenna elements based on at least part of the mobility information of the electronic device, the beam being used to search for or communicate with an external electronic device, and forming the beam having the identified beam width.

16 Claims, 18 Drawing Sheets

(51) Int. Cl.
*H04W 88/06* (2009.01)
*H03G 3/30* (2006.01)
*H03F 3/193* (2006.01)
*H04W 64/00* (2009.01)

(52) U.S. Cl.
CPC ......... *H04W 4/027* (2013.01); *H04W 64/006* (2013.01); *H03F 2200/294* (2013.01); *H04W 88/06* (2013.01)

(56) References Cited

U.S. PATENT DOCUMENTS

| | | | |
|---|---|---|---|
| 2012/0162009 A1 | 6/2012 | Kim et al. | |
| 2013/0040655 A1* | 2/2013 | Keidar | H01Q 1/246 455/456.1 |
| 2013/0040682 A1* | 2/2013 | Chang | H04B 7/0417 455/517 |
| 2013/0057432 A1* | 3/2013 | Rajagopal | H01Q 3/26 342/368 |
| 2014/0225775 A1 | 8/2014 | Clevorn et al. | |
| 2016/0006122 A1 | 1/2016 | Seol et al. | |
| 2016/0066197 A1 | 3/2016 | Park et al. | |
| 2016/0066279 A1* | 3/2016 | Lee | H04W 4/90 370/311 |
| 2017/0164305 A1* | 6/2017 | Johansson | H03G 3/3078 |
| 2017/0318590 A1 | 11/2017 | Byun et al. | |
| 2017/0339575 A1 | 11/2017 | Kim et al. | |
| 2018/0013477 A1 | 1/2018 | Kim et al. | |
| 2018/0054244 A1 | 2/2018 | Kim et al. | |

FOREIGN PATENT DOCUMENTS

| | | |
|---|---|---|
| KR | 10-2016-0088661 A | 7/2016 |
| KR | 10-2017-0129377 A | 11/2017 |
| WO | 2014/021633 A1 | 2/2014 |
| WO | 2016/018121 A1 | 2/2016 |
| WO | 2016/072534 A1 | 5/2016 |

OTHER PUBLICATIONS

European Search Report dated Dec. 13, 2019.
Namiot, Dmitry, Geofence and Network Proximity, pp. 1-6, Best Available Date: Mar. 24, 2013.
European Search Report dated Mar. 30, 2021.

* cited by examiner

ELECTRONIC DEVICE FOR CONTROLLING BEAM WIDTH AND METHOD THEREOF

CROSS-REFERENCE TO RELATED APPLICATION(S)

This application is based on and claims priority under 35 U.S.C. 119 of Korean Patent Application No. 10-2018-0100411, filed on Aug. 27, 2018, in the Korean Intellectual Property Office, the disclosure of which is herein incorporated by reference in its entirety.

BACKGROUND

Field

The disclosure relates to an electronic device for controlling a beam width based on mobility and a method thereof.

Description of Related Art

With the explosive growth of wireless services, frequency resources have become more and more scarce. Nonetheless, wireless service users still demand high-quality services with high throughput and low latency. To provide new wireless services (e.g., a $5^{th}$ generation (5G) cellular system), a broadband wireless system operating in a high frequency band is under development. For example, the $3^{rd}$ generation partnership project (3GPP) new radio (NR) standards for 5G service also specify communication standards for wireless communication in a millimeter (mm) frequency band (above 6 GHz). Due to much radio propagation loss in high-frequency bands such as mmWave, the use of an omni-directional antenna as in long term evolution (LTE) may make wireless communication between a base station (BS) and an electronic device difficult. Therefore, the 3GPP NR standards also specify application of beamforming between a BS and an electronic device such that radio propagation loss in a high frequency band may be overcome through beamforming. Beamforming is a directional antenna technique using a plurality of antenna elements, in which a transmission and reception antenna gain may be increased in a desired direction by adjusting the phases of signals transmitted from the plurality of antenna elements. Beamforming may be carried out in both a BS and an electronic device. The BS may transmit a reference signal for signal synchronization or a reference signal for beamforming itself so that the electronic device may select a BS beam (e.g., BS beam A) offering the best signal quality. Further, the electronic device may select an electronic device beam (e.g., electronic device beam Y) offering the best signal quality to the BS from among available electronic device beams, and use the selected electronic device beam. By this operation, the best pair of a BS beam and an electronic device beam (e.g., BS beam A-electronic device beam Y) may be formed.

The electronic device may generate a plurality of electronic device beams, repeat an operation of detecting an electronic device beam having the best radio signal quality in a set of available electronic device beams, and maintain the detected electronic device beam. The electronic device may sequentially measure the radio signal qualities of all electronic device beams and use and maintain an electronic device beam having the best radio signal quality (the best electronic device beam) among the electronic device beams. The best electronic device beam may be changed even at a slight motion of the electronic device, such as rotation. To maintain the best electronic device beam, an orientation variation of the electronic device may be computed by means of a built-in sensor (e.g., an accelerator or gyroscope), and the orientation of the electronic device beam may be compensated by as much as the computed orientation variation. For example, if a user moves the electronic device at a fixed position, with a BS beam fixed (e.g., if the user switches to landscape/portrait mode by rotating the electronic device by 90 or 270 degrees), the electronic device beam may be compensated by changing its beamforming orientation. However, if the user carrying the electronic device moves (e.g., walks, runs, rides a bike, or moves in a vehicle), the best BS beam may be changed and the best electronic device beam may also be changed. For example, the best electronic device beam may continue changing, while the user is moving. As such, when the user is making a motion, the electronic device beam may be steered in an unintended direction.

The above information is presented as background information only to assist with an understanding of the disclosure. No determination has been made, and no assertion is made, as to whether any of the above might be applicable as prior art with regard to the disclosure.

SUMMARY

An aspect of the disclosure may provide an electronic device for maintaining a high radio signal quality by controlling a beam width based on mobility of the electronic device and a method thereof.

An electronic device comprises a first communication circuit configured to transmit at least one radio frequency (RF) signal, at least one antenna structure, electrically coupled to the first communication circuit, and including a plurality of antenna elements, at least one processor operatively coupled to the first communication circuit, and memory operatively coupled to the at least one processor. The memory stores instructions that, when executed by the at least one processor, causes the processor to perform a plurality of operation. The plurality of operations comprises identifying mobility information of the electronic device, identifying a beam width of a beam formed by at least a part of the plurality of antenna elements based on at least part of the mobility information of the electronic device, the beam being used to search for or communicate with an external electronic device, and forming the beam having the identified beam width.

According to another embodiment, a method of controlling a beam width of a beam in an electronic device comprises identifying mobility information of the electronic device, identifying a beam width of a beam formed by at least a part of a plurality of antenna elements based on the mobility information of the electronic device, the beam being used to search for or communicate with an external electronic device, and forming the beam having the identified beam width.

According to various embodiments, an electronic device comprises a housing including a first plate, a second plate facing in an opposite direction to the first plate, and a side surface member surrounding a space between the first plate and the second plate, and coupled to the second plate or integrally formed with the second plate, a display exposed through part of the first plate, an antenna positioned inside the housing and including a printed circuit board (PCB) and a plurality of antenna elements disposed on the PCB, a wireless communication processor electrically coupled to the plurality of antenna elements, and configured to transmit and/or receive a signal of a frequency between 3 GHz and 100 GHz, at least one sensor operatively coupled to the wireless communication processor, and memory operatively coupled to the wireless communication processor. The memory instructions that, when executed by the wireless communication processor, cause the wireless communication processor to performing a plurality of operations comprising. The plurality of operations comprises obtaining information related to a motion of the electronic device from the at least one sensor, and selecting antenna elements to transmit and/or receive the signal from among the plurality of antenna elements and/or determine power to be supplied to each of the selected antenna elements, based on at least part of the information related to the motion.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

The above and other aspects, features, and advantages of certain exemplary embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
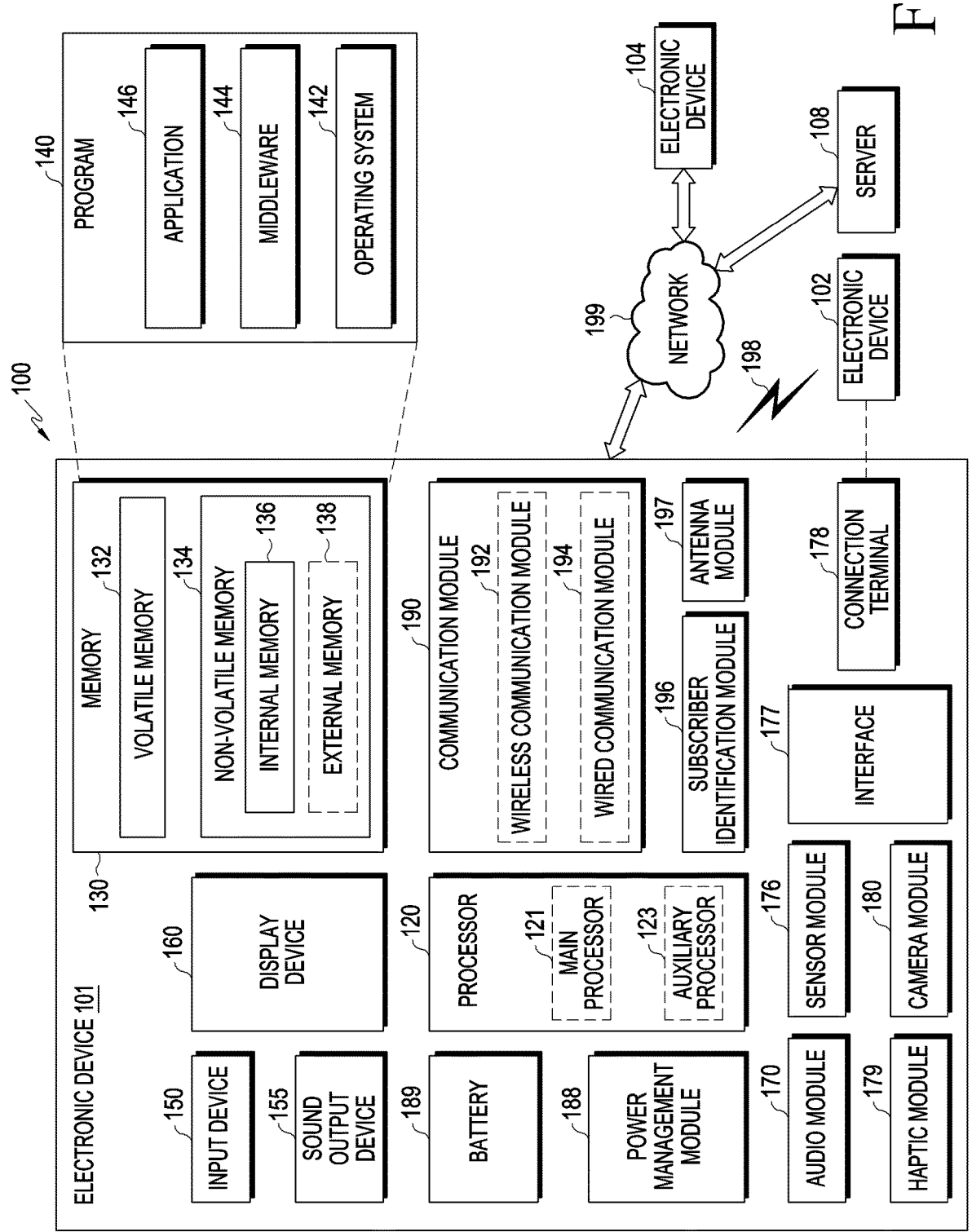
FIG. 1 is a block diagram illustrating an electronic device in a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing a recording, and the receiver may be used for an incoming calls. According to an embodiment, the receiver may be implemented as separate from or as part of the speaker.

The display device 160 may visually provide information to the outside (e.g., a user) of the electronic device 101. The display device 160 may include, for example, a display, a hologram device, or a projector and control circuitry to control a corresponding one of the display, a hologram device, and a projector. According to an embodiment, the display device 160 may include touch circuitry adapted to detect a touch or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101 and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and at least one antenna appropriate for a communication scheme used in the communication network, such as the first network 198 or the second network 199, may be selected, for example, by the communication module 190 (e.g., the wireless communication module 192) from the antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
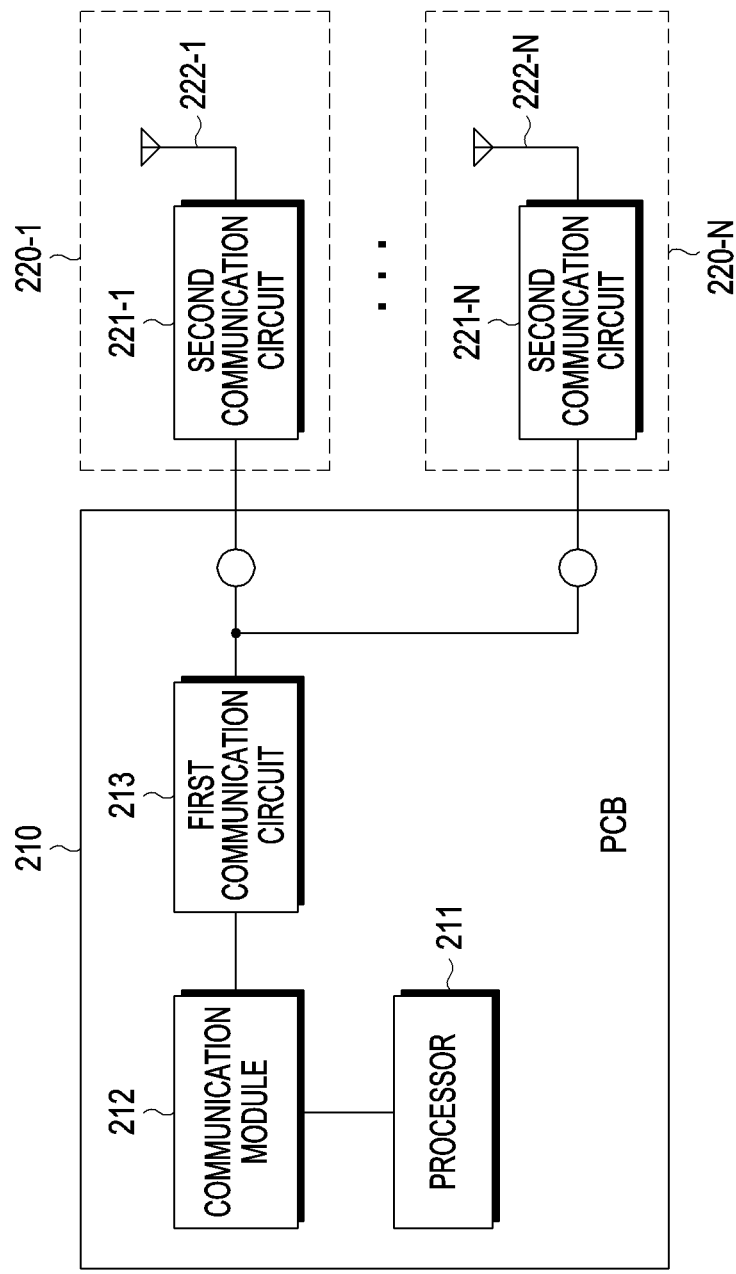
FIG. 2 is a simplified block diagram illustrating a configuration of an electronic device according to certain embodiments.

FIG. 2 is a simplified block diagram illustrating a configuration of an electronic device according to certain embodiments. Referring to FIG. 2, the electronic device according to certain embodiments may include a printed circuit board (PCB) 210 and at least one communication device 220 (e.g., a plurality (e.g., N)) of communication devices 220-1 to 220-N).

The communication devices 220-1 to 220-N may include a plurality of second communication circuits 221-1 to 221-N (collectively, denoted by 221) and a plurality of antennas 222-1 to 222-N (collectively, denoted by 222) coupled to the second communication circuits 220-1 to 220-N. Each of the antennas 222-1, . . . , 222-N may include a plurality of antenna elements.

The PCB 210 can includes, among other items, a processor 211, a communication module 212, and a first communication circuit 213 mounted thereon. According to an embodiment, a processor 211 (e.g., the processor 120, hereinafter, notwithstanding that the term "processor" refers to the singular context, the term shall be understood to mean the singular and plural contexts), a communication module 212 (e.g., the communication module 190), or a first communication circuit 213 (e.g., a radio frequency integrated chip (RFIC), an intermediate frequency integrated chip (IFIC), or a transceiver) may be mounted or arranged on the PCB 210.

According to an embodiment, the processor 211 may, for example, control at least one other component of an electronic device coupled to the processor 211 by executing software (e.g., a program). The processor 211 may load a command(s) and/or data received from another component (e.g., the communication module 212) or a memory (e.g., the memory 130), execute the command or use the data, such as store data resulting from the processing in the memory.

According to an embodiment, the communication module 212 may support establishment of a wired or wireless communication channel and communication on the established communication channel between the electronic device and an external electronic device. The communication module 212 may include one or more communication processors which support wired communication or wireless communication, operating independently of the processor 211 (e.g., an AP).

According to certain embodiments, the processor 211 and the communication module 212 may be implemented in one chip. At least part of the functions of the processor 211 and at least part of the functions of the communication module may be implemented in one chip.

According to an embodiment, the first communication circuit 213 may include a modulator and/or a demodulator (MODEM), filters, and amplifiers. For example, the first communication circuit 213 may modulate a transmission signal generated from the communication module 212 or the processor 211 to an RF signal or an IF signal through the modulator. The first communication circuit 213 may, for example, demodulate RF signals or IF signals received through the second communication circuits 221-1 to 221-N.

According to certain embodiments, each of the second communication circuits 221-1 to 221-N may receive an RF signal modulated by the first communication circuit 213, amplify and/or process the modulated RF signal, and transmit the amplified and/or processed RF signal through an antenna 222 over the air. According to certain embodiments, each of the second communication circuits 221-1 to 221-N may receive an IF signal modulated by the first communication circuit 213, convert the received IF signal to an RF signal, amplify and/or process the RF signal, and transmit the amplified and/or processed signal through an antenna 222.

According to certain embodiments, pairs of ones of the second communication circuits 221 and ones of the antennas 222 each including a plurality of antenna elements may form, respective module(s). This module may be referred to as the "communication device(s) 220". According to certain embodiments, the communication devices 220 including the plurality of communication circuits 221 and the corresponding plurality of antennas 222 may be configured as separate devices, modules, or circuits and at least part of the communication devices 220 may be incorporated in the PCB 210.

Figure 3A:
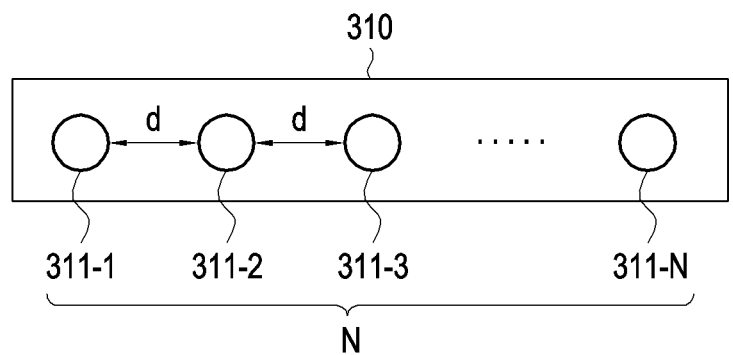
FIG. 3A and FIG. 3B are diagrams illustrating a beamforming method using a plurality of antenna elements.
Figure 3B:
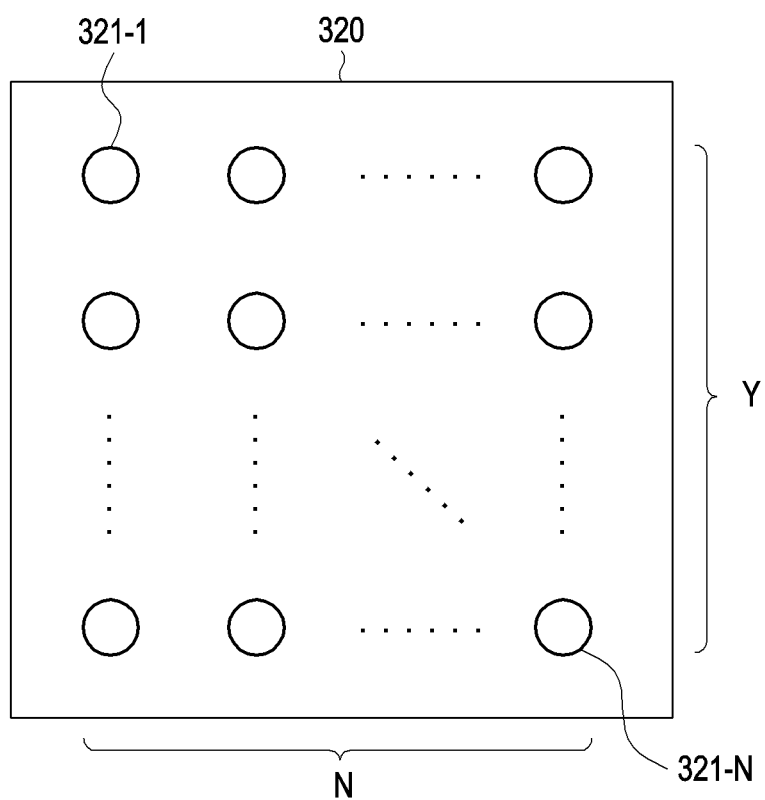

FIG. 3A and FIG. 3B are diagrams illustrating a beamforming method using a plurality of antenna elements. Beamforming is a directional antenna technique using a plurality of antenna elements, in which a transmission and reception antenna gain is maximized in an intended direction by adjusting the phase of a signal transmitted and/or received through each of the plurality of antenna elements. For example, beamforming may be used to transmit and receive signals in an RF band (e.g., a frequency between 3 GHz to 100 GHz). For example, as illustrated in FIG. 3A, N antenna elements 311-1 to 311-N may be arranged one-dimensionally and operate as an antenna array 310. In another example, as illustrated in FIG. 3B, N antenna elements 321-1 to 321-N may be arranged in a two-dimensional X×Y matrix and operate as an antenna array 320.

Returning to FIG. 3A, the following description is given of a method of calculating a beam width for the antenna array 310 being a one-dimension (1D) matrix, by way of example. Each of the N antenna elements 311 to 311-N may transmit and receive a signal having a specific phase value through a phase shifter (or, may transmit and receive a signal having a specific relative phase offset from another antenna element). Steering a final signal in which these signals are overlapped in a specific direction may be referred to as beamforming. The array factor (AF) of the antenna 310 in which the N antenna elements 311-1 to 311-N are arranged linearly may be given by [Equation 1].

$$AF = I_0 e^{j\beta z_0 \cos\theta} + I_1 e^{j\beta z_1 \cos\theta} \ldots + I_{N-1} e^{j\beta z_{N-1} \cos\theta}$$  [Equation 1]

where $I_n$ represents excitation for the $N^{th}$ antenna element 311-N, $Z_n$ represents the position of the $N^{th}$ antenna element 311-N, β represents a wave number, j=sqrt(−1), and θ represents a beam direction. If all antenna elements have the same amplitude excitation and linearly increasing phase excitations (e.g., $I_0=1$, $I_1=e^{j\alpha}$, $I_2=e^{j2\alpha}$, $I_n=e^{jn\alpha}$, ...) and the distance d between every adjacent antenna element (e.g., the first antenna element 311-1 and the second antenna element 311-2) is uniform, the AF may be expressed as [Equation 2].

$$AF = \frac{\sin(N\psi/2)}{N\sin(\psi/2)}$$  [Equation 2]

where ψ=βd cos θ+α. A beam width may refer to a 3-dB beam width in an antenna radiation pattern, and the beam width for the AF of [Equation 2] may be given by [Equation 3].

$$BW = \frac{0.88\lambda}{dN}$$  [Equation 3]

Referring to [Equation 3], the beam width may vary according to the distance d between antenna elements and the number N of antenna elements. As the beam width increases, signals transmitted and received in a larger range may be covered, but with a decreased gain.

Figure 4A:
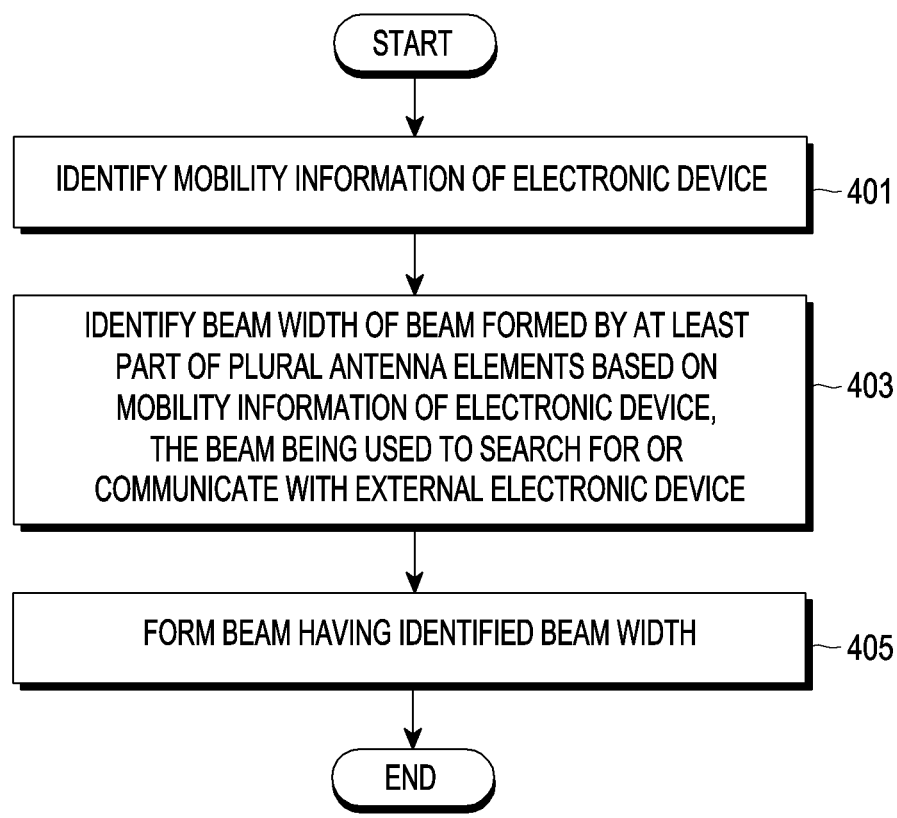
FIG. 4A and FIG. 4B are flowcharts illustrating a beamforming method according to certain embodiments.
Figure 5A:
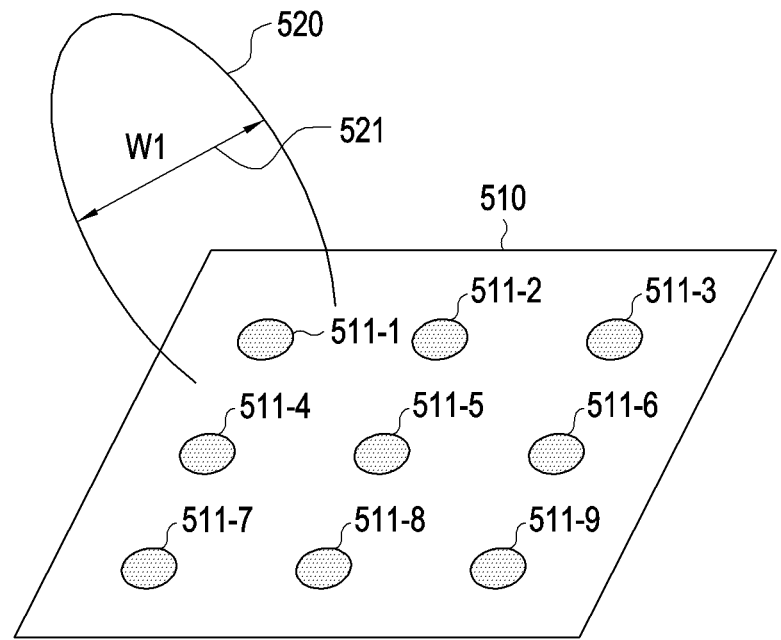
FIG. 5A, FIG. 5B, FIG. 5C, and FIG. 5D are diagrams illustrating variations in a beam width according to numbers of operating antenna elements according to certain embodiments.
Figure 5B:
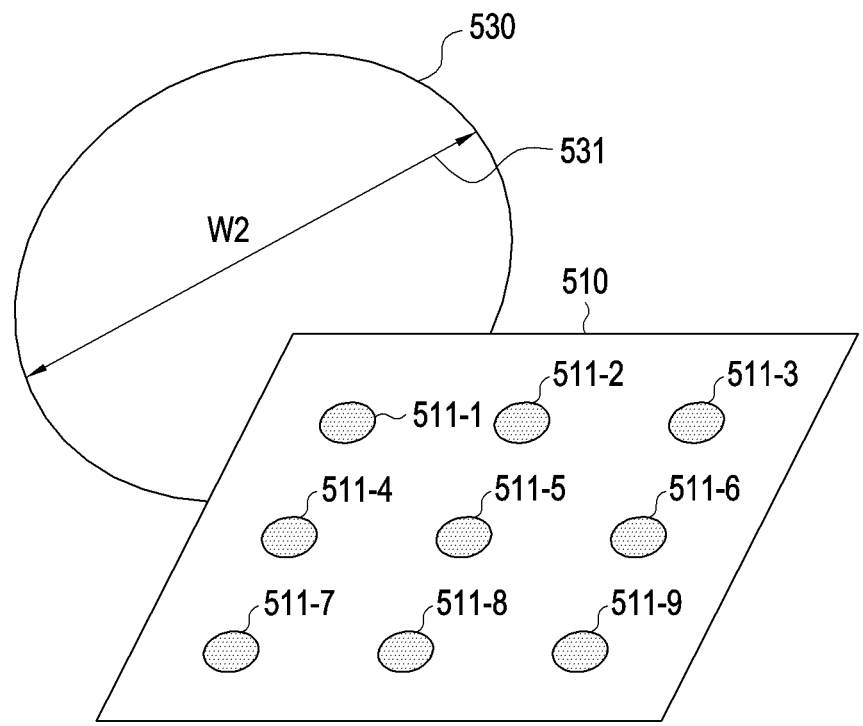
Figure 5C:
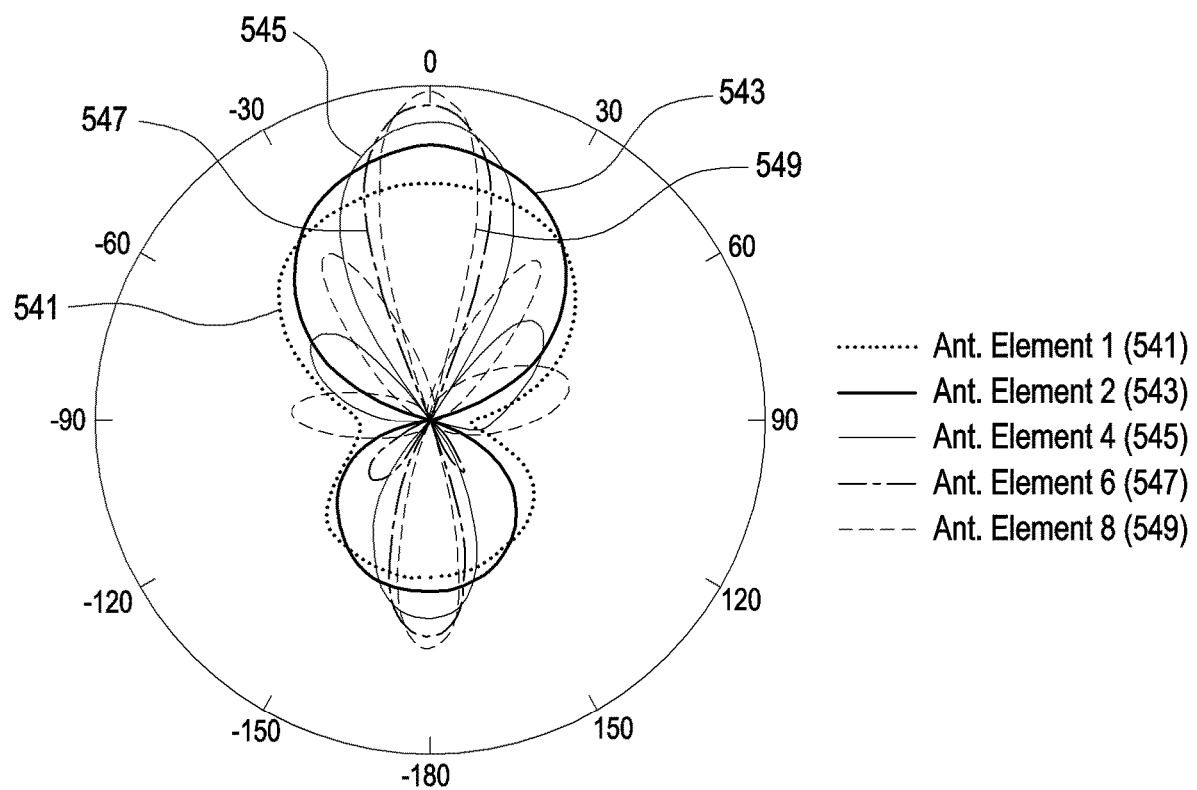
Figure 5D:
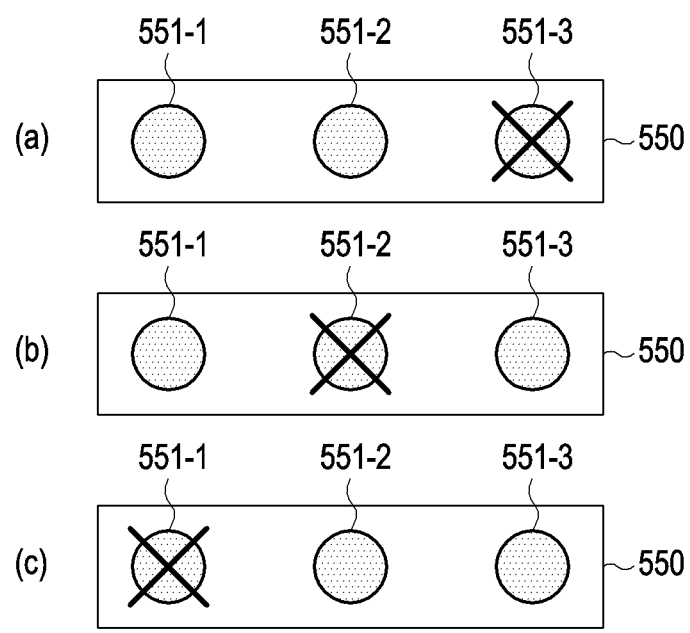
Figure 6A:
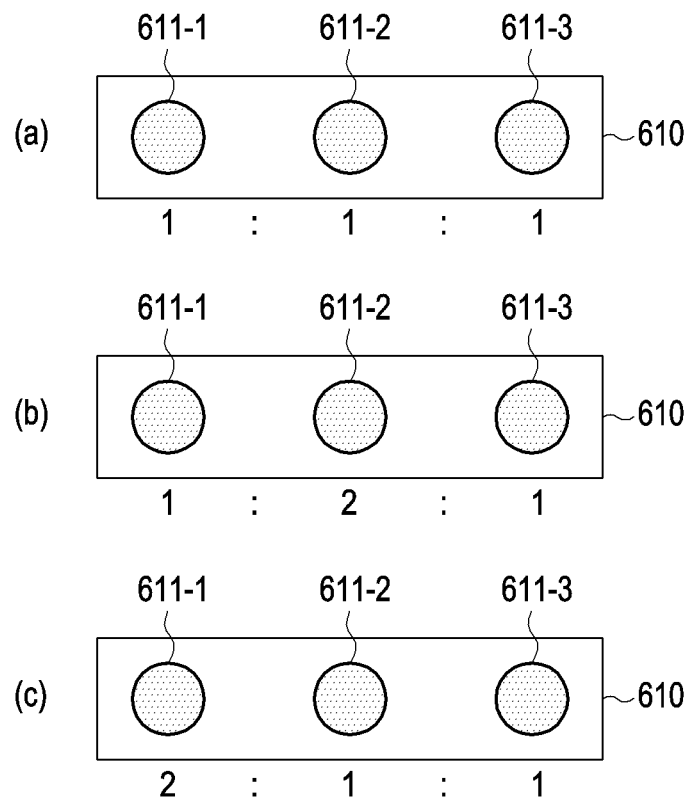
FIG. 6A and FIG. 6B are diagrams illustrating variations in a beam width according to power ratios between antenna elements according to certain embodiments.
Figure 6B:
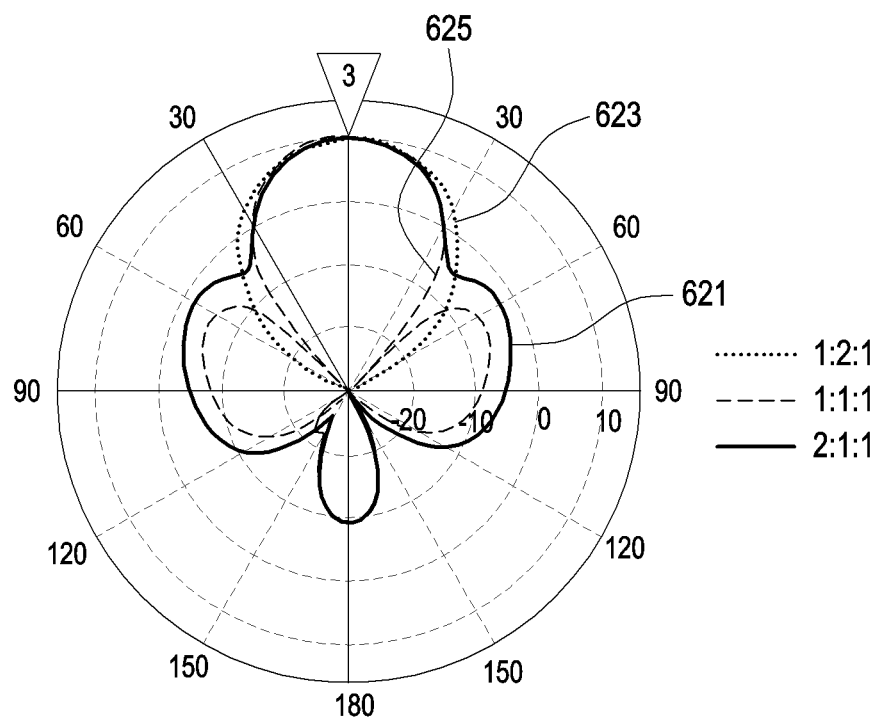

FIG. 4A is a flowchart illustrating a beamforming method according to certain embodiments. The embodiment of FIG. 4A will be described in greater detail with reference to FIGS. 5A to 6B. FIGS. 5A to 5D are diagrams illustrating variations in a beam width according to numbers of antenna elements. FIGS. 6A and 6B are diagrams illustrating variations in a beam width according to power ratios between antenna elements.

According to certain embodiments, the electronic device 101 (e.g., the processor 120) may identify mobility information of the electronic device 101 in operation 401. For example, identifying the mobility information of the electronic device 101 may amount to identifying the speed (which can be instantaneous speed, speed over average distance or time, may include direction) of the electronic device 101. The electronic device 101 may identify its mobility information, using a sensor (e.g., an accelerator sensor, a gyro sensor, or a geomagnetic sensor). Further, the electronic device 101 may identify the mobility information of the electronic device 101 by using a global positioning system (GPS) signal, a cellular signal, a WiFi signal, and/or the Doppler shift of a cellular signal. The electronic device 101 may identify that the user carrying the electronic device 101 is engaged in at least one activity of "being stationary", "walking", "running", "riding a slow moving object" (e.g., a bike, an e-scooter, or the like"), or "riding a fast moving object" (e.g., a vehicle, a train, or the like). The electronic device 101 may communicate with an external electronic device (e.g., the electronic device 102 or 104) by a beam having the best radio signal quality among a plurality of beams that the electronic device 101 may form. The external electronic device may be, for example, a BS or a device-to-device (D2D) terminal. The beam by which the electronic device 101 communicates with the external electronic device may be referred to as the best beam. Since beamforming is a directional antenna technique, if the electronic device 101 moves or rotates, the best beam may change or if the best beam is maintained, the radio signal quality may degrade. Accordingly, the electronic device 101 may maintain a selected radio signal quality by controlling a property of a beam (e.g., the width of the beam) based on the mobility information of the electronic device 101.

According to certain embodiments, the electronic device 101 may identify a beam width formed by at least a part of a plurality of antenna elements based on the mobility information of the electronic device 101 in operation 403. According to certain embodiments, a beam may be used to search for or communicate with an external electronic device. As illustrated in FIGS. 5A and 5B, the electronic device 101 may form beams having various beam widths.

In certain embodiments, antenna 510 may form a planar member within housing of the electronic device substantially parallel to the first plate and the second plate of dielectric material formed between the antenna elements 511. In certain embodiments, the antenna 510 can be formed as part of the second plate corresponding to the rear of the electronic device 100.

For example, as illustrated in FIG. 5A, a beam width 521 of a beam 520 formed by a plurality of antenna elements 511-1 to 511-9 in an antenna 510 may be W1. In another example, as illustrated in FIG. 5B, a beam width 531 of a beam 530 formed by some antenna elements 511-1 to 511-8 among the plurality of antenna elements 511-1 to 511-9 in the antenna 510 may be W2. For example, W2 may be large than W1. As such, the electronic device 101 may form beams having various beam widths and identify the beam width of a beam to be formed, based on the identified mobility information of the electronic device 101. For example, a beam may be wider when the electronic device 101 has high mobility than when the electronic device 101 has low mobility, to thereby conduct communication over a wider range. For example, the high mobility of the electronic device 101 may mean that the electronic device 101 moves at a high or irregular speed.

Referring to FIG. 4A, the electronic device 101 may form a beam having the identified beam width according to certain embodiments in operation 405. The beam width and transmission and reception gain of the formed beam may vary according to the number of operating antenna elements involved in forming the beam and/or the magnitude of power applied to a plurality of antenna elements.

According to an embodiment, the electronic device 101 may form the beam having the identified beam width by controlling the number of operating antenna elements. For example, as illustrated in FIG. 5C, various beam patterns may be generated according to the number of operating antenna elements. The circumference measures angle, while the radius measures signal strength as a function of the angle. It is assumed that when the number of antenna elements increases from N to N+1, the distance d between adjacent antenna elements is maintained. A case in which the number of operating antenna elements is 1 (denoted by reference numeral 541), 2 (denoted by reference numeral 543), 4 (denoted by reference numeral 545), 6 (denoted by reference numeral 547), or 8 (denoted by reference numeral 549) is illustrated in FIG. 5C, respectively. Referring to FIG. 5C, it may be noted that as the number of operating antenna elements decreases, the beam width increases and the gain decreases. For example, as illustrated in FIG. 5D, the electronic device 101 may adjust the number of operating antenna elements to 2, among three antenna elements 551-1, 551-2, and 551-3 included in an antenna 550. When selecting a part of the antenna elements as operating antenna elements, the electronic device 101 may select the operating antenna elements such that the distance d between the operating antenna elements is maintained. For example, the electronic device 101 may select a first antenna element 551-1 and a second antenna element 551-2 as operating antenna elements as illustrated in FIG. 5D(a) or the second antenna element 551-2 and a third antenna element 551-3 as operating antenna elements as illustrated in FIG. 5D(C), to which a method for selecting operating antenna elements is not limited. As illustrated in FIG. 5D(b), the first antenna element 551-1 and the third antenna element 551-3 may be selected as operating antenna elements. That is, in FIG. 5D, the antenna elements 551 are binary turned on/off.

In another embodiment, the electronic device 101 may form a beam having an identified beam width by controlling a power ratio between a plurality of antenna elements. For example, as illustrated in FIG. 6A(a), a power ratio among three antenna elements 611-1, 611-2, and 611-3 included in an antenna 610 may be controlled to be 1:1:1. When the power ratio is controlled to be 1:1:1, a beam pattern 625 illustrated in FIG. 6B may be achieved. As illustrated in FIG. 6A(b), the electronic device 101 may control the power ratio among the three antenna elements 611-1, 611-2, and 611-3 included in the antenna 610 to be 1:2:1. When the power ratio is controlled to be 1:2:1, a beam pattern 623 illustrated in FIG. 6B may be achieved. If the electronic device 101 controls the power ratio among the three antenna elements 611-1, 611-2, and 611-3 included in the antenna 610 to be 2:1:1 as illustrated in FIG. 6A(c), a beam pattern 621 illustrated in FIG. 6B may be achieved. It may be noted from FIG. 6B that a beam has a different beam width according to the ratio of power applied to a plurality of antenna elements.

Figure 4B:
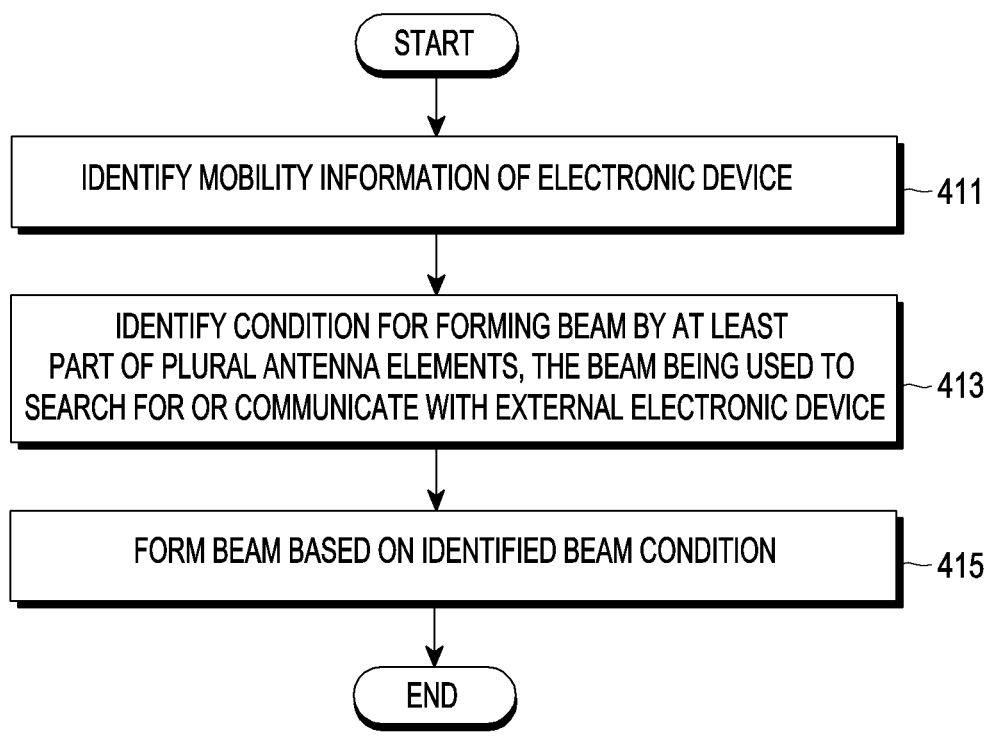

FIG. 4B is a flowchart illustrating a beamforming method according to certain embodiments.

According to certain embodiments, the electronic device 101 (e.g., the processor 120) may identify mobility information of the electronic device 101 in operation 411. Operation 411 may be substantially identical to the afore-described operation 401.

According to certain embodiments, the electronic device 101 may identify a condition for forming a beam used to search for or communicate with an external electronic device by at least a part of a plurality of antenna elements. For example, identifying a beamforming condition may amount to identifying the number of operating antenna elements among a plurality of antenna elements included in an antenna or a power ratio among the plurality of antenna elements.

According to certain embodiments, the electronic device 101 may form a beam based on the identified condition in operation 415. The beam formed based on the identified condition may have a larger beam width for high mobility of the electronic device 101 and a small beam width for low mobility of the electronic device 101.

In an embodiment, the electronic device 101 may be configured to identify a beam width based on mobility and control formation of the identified beam width, as illustrated in FIG. 4A. In another embodiment, the electronic device 101 may be configured to generate a beam based on correlation information between mobility and a beamforming condition under an identified beamforming condition, as illustrated in FIG. 4B. In this case, the electronic device 101 may not identify a beam width directly.

Figure 7:
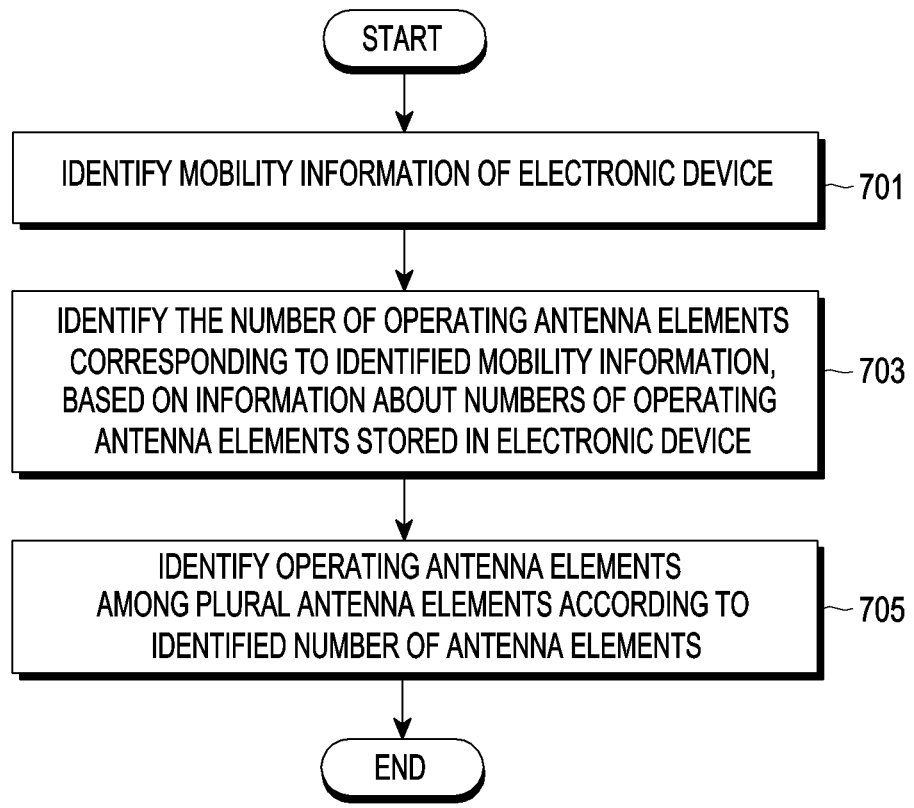
FIG. 7 is a diagram illustrating a method of identifying the number of operating antenna elements according to certain embodiments.

FIG. 7 is a flowchart illustrating a method of identifying the number of operating antenna elements according to certain embodiments.

According to certain embodiments, the electronic device 101 (e.g., the processor 120) may identify mobility information of the electronic device 101 in operation 701. Operation 701 may be substantially identical to the afore-described operation 401.

According to certain embodiments, the electronic device 101 may identify the number of operating antenna elements 511 corresponding to the identified mobility information based on information of numbers of operating antenna elements 511 stored in the electronic device 101 in operation 703. For example, the electronic device 101 may store the numbers of operating antenna elements 511 corresponding to mobility information as illustrated in [Table 1] in a memory. In certain embodiments, the memory storing Table 1 can be embedded or integrated with the communication module 212. Once the electronic device 101 identifies mobility information, the electronic device 101 may identify the number of operating antenna elements corresponding to the identified mobility information. For example, one of the sensors 176 (gyroscope, accelerometer, magnetometer) determines the speed of the electronic device 101. The processor 211 can receive the speed information and determine the appropriate mobility information corresponding to the speed and provide the mobility information to the communication module 212. The communication module 212 can uses the mobility information to fetch the number of operating antenna elements and provide the same to the first communication circuit 213.

TABLE 1

| Mobility information | Number of operating antenna elements |
|---|---|
| A | N |
| B | N − N1 |
| C | |
| D | |
| E | N − 2N1 |

For example, in [Table 1], A may represent "being stationary", B may represent "walking", C may represent "running", D may represent "riding a slow moving object", and E may represent "riding a fast moving object". The mobility information may be identified based on the speed of the electronic device 101. In [Table 1], N may be the number of a plurality of antennas included in an antenna, and N1 may be 1. For example, if the speed of the electronic device 101 is 5 km/h, the electronic device 101 may identify B (walking), and exclude one of the plurality of antenna elements included in the antenna.

According to certain embodiments, the electronic device 101 may identify operating antenna elements among the plurality of antenna elements according to the identified number of antenna elements in operation 705. For example, the electronic device 101 may identify the operating antenna elements in consideration of a beam width variable according to selection of operating antenna elements and/or the characteristics of a grating lobe, to which a method of selecting an operating antenna element according to the number of the operating antenna elements is not limited.

Figure 8:
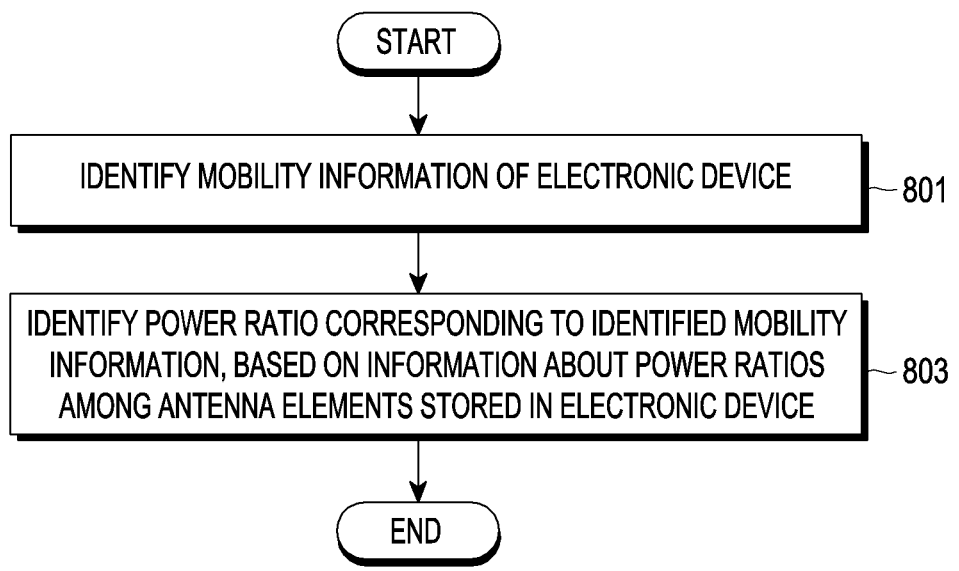
FIG. 8 is a diagram illustrating a method of identifying a power ratio between antenna elements according to certain embodiments.

FIG. 8 is a flowchart illustrating a method of identifying a ratio of power applied to respective antenna elements.

According to certain embodiments, the electronic device 101 (e.g., the processor 120) may identify mobility information of the electronic device 101 in operation 801. Operation 801 may be substantially identical to the afore-described operation 401.

According to certain embodiments, the electronic device 101 may identify a power ratio corresponding to the identified mobility information, based on information about power ratios among the plurality of antenna elements, stored in the electronic device 101 as illustrated in [Table 2].

In certain embodiments, Table 2 can be stored in memory, such as memory integrated with the communication module 212.

TABLE 2

| Mobility information | Power ratio |
|---|---|
| A | 1:1:1 |
| B | 2:1:1 |
| C | |
| D | |
| E | 1:2:1 |

For example, in [Table 2], A may represent "being stationary", B may represent "walking", C may represent "running", D may represent "riding a slow moving object", and E may represent "riding a fast moving object". The mobility information may be identified based on the speed of the electronic device 101. For example, if the speed of the electronic device 101 is 15 km/h, the electronic device 101 may identify E (riding a fast moving object) and control a power ratio among the plurality of antenna elements to be 1:2:1. The specific mobility information and power ratio are merely exemplary and do not limit the disclosure.

Figure 9:
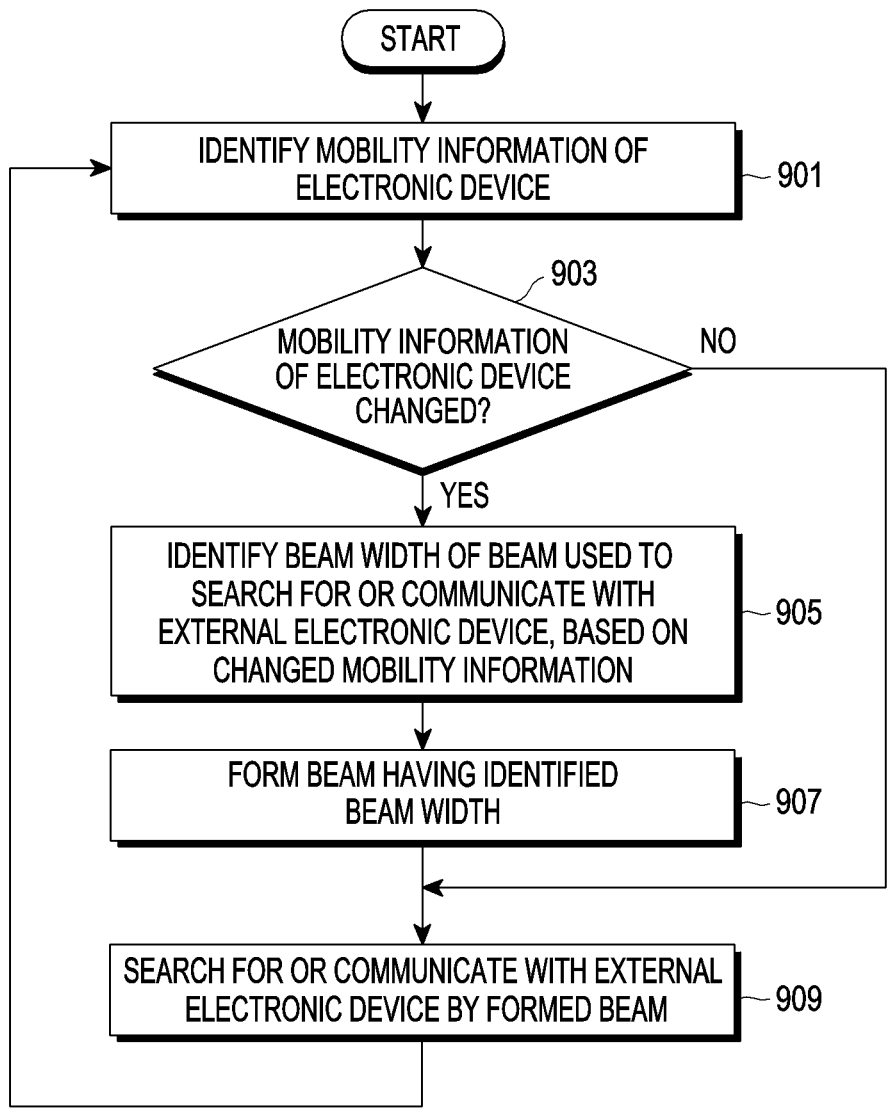
FIG. 9 is a flowchart illustrating a beamforming method according to certain embodiments.

FIG. 9 is a flowchart illustrating a beamforming method according to certain embodiments.

According to certain embodiments, the electronic device 101 (e.g., the processor 120) may identify mobility information of the electronic device 101 in operation 901 (e.g., left column of Tables 1 or 2). The electronic device 101 may periodically identify mobility information of the electronic device 101, and the mobility information may be based on the speed of the electronic device 101.

According to certain embodiments, the electronic device 101 may determine whether the mobility information has been changed in operation 903.

According to certain embodiments, if determining that the mobility information has been changed, the electronic device 101 may identify the beam width of a beam used to search for or communicate with an external electronic device (e.g., the electronic device 102 or 104), based on the changed mobility information. For example, if determining that the mobility information of the electronic device 101 has been changed from "walking" to "riding a fast moving object", the electronic device 101 may identify the beam width of a beam corresponding to "riding a fast moving object".

According to certain embodiments, the electronic device 101 may form a beam having the identified beam width in operation 907. To form the beam having the identified beam width, the electronic device 101 may identify the number of operating antenna elements among the plurality of antenna elements included in the antenna or a power ratio among the plurality of antenna elements (right column of Tables 1 and 2). Then, the electronic device 101 may form the beam having the identified beam width by using the identified number of operating antenna elements or the power ratio among the plurality of antenna elements.

While it has been described that a beam width corresponding to mobility information is identified and a beam having the identified beam width is formed in operations 905 and 907, a beamforming condition corresponding to mobility information may be identified and a beam may be formed based on the identified beamforming condition, as described before with reference to FIG. 4B.

According to certain embodiments, the electronic device 101 may search for an external electronic device or communicate with the external electronic device by the formed beam in operation 909. If determining that the mobility information has not been changed in operation 903, the electronic device 101 may not perform operation 905 for identifying a beam width and operation 907 for forming a beam having the identified beam. Since the mobility information of the electronic device 101 has not been changed, the beam having the identified beam width may be maintained based on the existing mobility information. Accordingly, when the mobility information is not changed, the operation of identifying a beam width may not be performed.

According to certain embodiments, the electronic device 101 may search for an external electronic device or communicate with the external electronic device by the formed beam in operation 909. If determining that the mobility information has not been changed, the electronic device 101 may search for an external electronic device or communicate with the external electronic device by the existing beam.

It is noted that when the electronic device 101 is in motion, it may arrive at a location where another BS is more suitable for communication. For example, the electronic device 101 may move from the reception area of one BS to the reception area of another BS.

Figure 10:
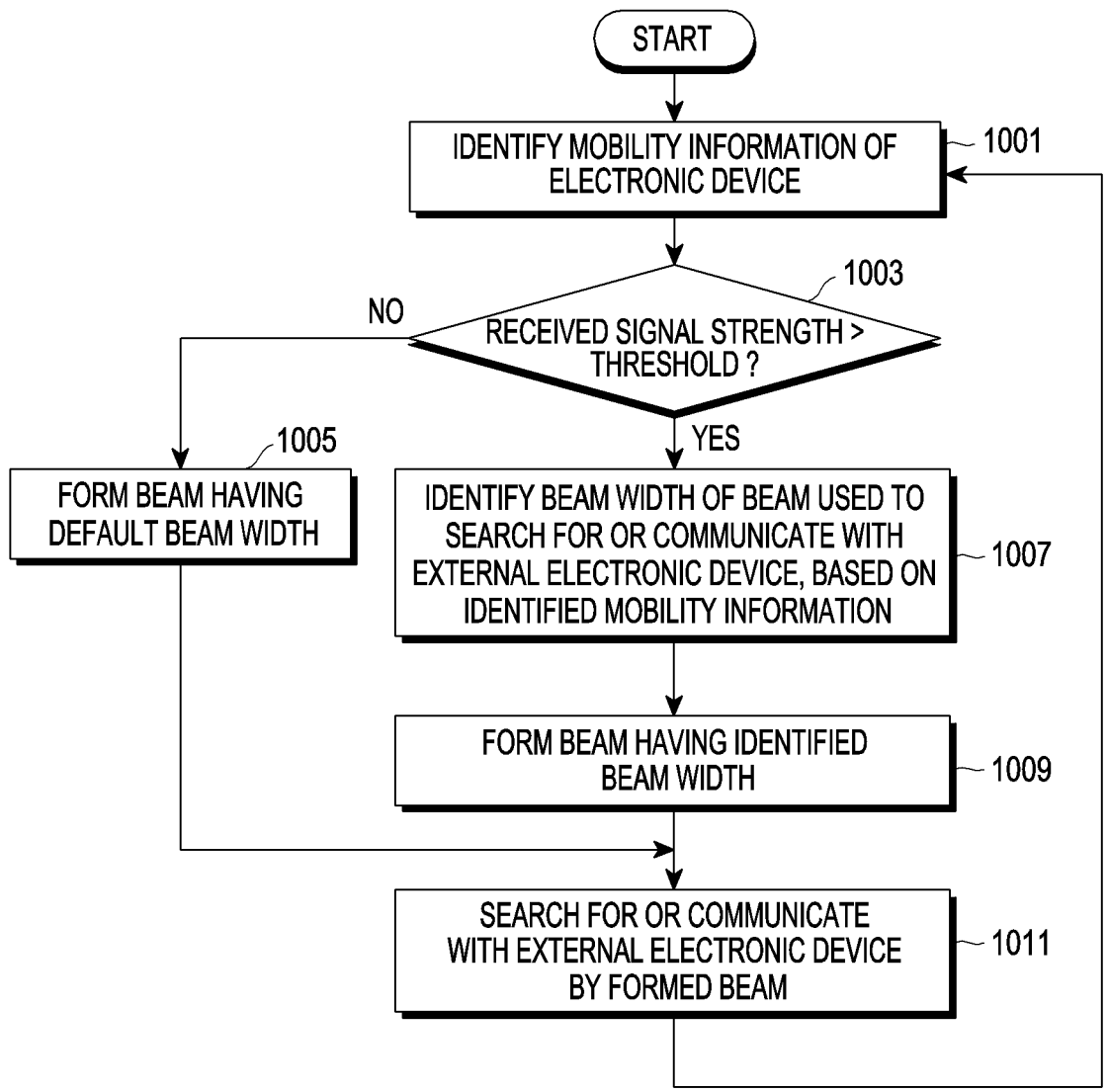
FIG. 10 is a flowchart illustrating a beamforming method according to certain embodiments.

FIG. 10 is a flowchart illustrating a beamforming method according to certain embodiments.

According to certain embodiments, the electronic device 101 (e.g., the processor 120) may identify mobility information of the electronic device 101 in operation 1001. Operation 1001 may be substantially identical to the afore-described operation 401.

According to certain embodiments, the electronic device 101 may determine whether a received signal strength is larger than a threshold in operation 1003.

According to certain embodiments, if determining that the received signal strength is less than or equal to the threshold, the electronic device 101 may form a beam having a default beam width in operation 1005. For example, if the number of operating antenna elements is decreased to increase a beam width, a problem may occur to detection and demodulation of a wireless signal. Therefore, when the received signal strength is less than the threshold, the electronic device 101 may not perform operation 1007 for identifying a beam width and operation 1009. This can occur when the electronic device 101 moves from the reception area of one BS to another BS.

According to certain embodiments, if determining that the received signal strength is larger than the threshold, the electronic device 101 may identify the beam width of a beam used to search for or communicate with an external electronic device (e.g., the electronic device 102 or 104), based on the identified mobility information in operation 1007.

According to certain embodiments, the electronic device 101 may form a beam having the identified beam width in operation 1009. To form the beam having the identified beam width, the electronic device 101 may identify the number of operating antenna elements among the plurality of antenna elements included in the antenna or a power ratio among the plurality of antenna elements. The electronic device 101 may then form the beam having the identified beam width by using the identified number of operating antenna elements or the power ratio among the plurality of antenna elements.

While it has been described that a beam width corresponding to mobility information is identified and a beam having the identified beam width is formed in operations 1007 and 1009, a beamforming condition corresponding to mobility information may be identified and a beam may be formed based on the identified beamforming condition, as described before with reference to FIG. 4B.

According to certain embodiments, the electronic device 101 may search for or communicate with an external electronic device by the formed beam in operation 1011. For example, if the received signal strength is larger than the threshold, the electronic device 101 may search for or communicate with an external electronic device by the formed beam having the beam width corresponding to the mobility information. In another example, if the received signal strength is less than or equal to the threshold, the electronic device 101 may search for or communicate with an external electronic device by a beam having a default beam width.

Figure 11:
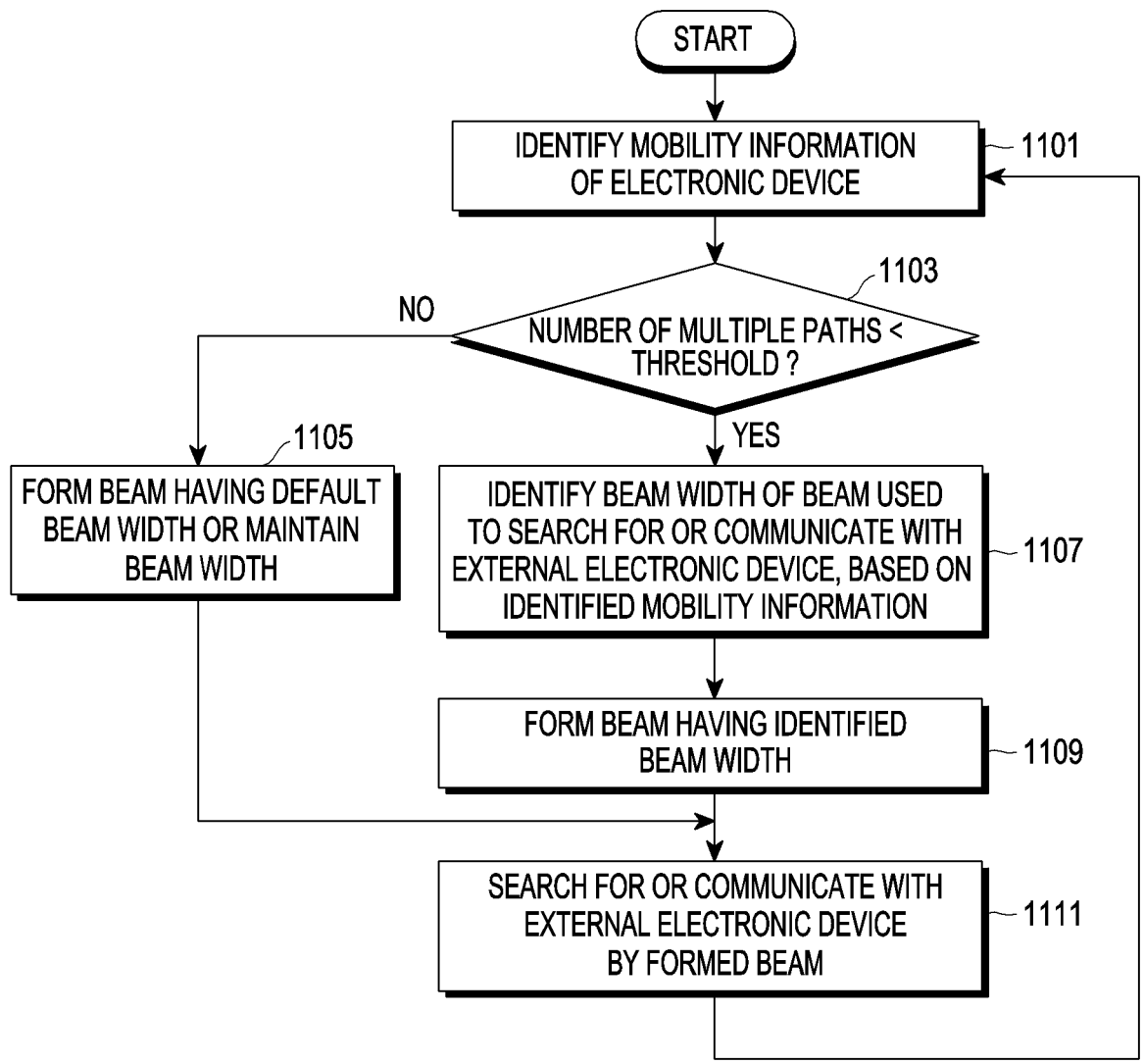
FIG. 11 is a flowchart illustrating a beamforming method according to certain embodiments.

FIG. 11 is a flowchart illustrating a beamforming method according to certain embodiments.

According to certain embodiments, the electronic device 101 (e.g., the processor 120) may identify mobility information of the electronic device 101 in operation 1101. Operation 1101 may be substantially identical to the afore-described operation 401.

According to certain embodiments, the electronic device 101 may determine whether the number of multiple paths is less than a threshold in operation 1103. For example, the presence of a large number of paths may mean the presence of a plurality of pairs of BS beams and electronic device beams.

According to certain embodiments, if the number of multiple paths is larger than or equal to the threshold, the electronic device 101 may form a beam having a default beam width or maintain a beam width. For example, if the number of multiple paths is larger than or equal to the threshold, a problem caused by the mobility of the electronic device is likely to be overcome, in spite of narrow beams. Therefore, if the number of multiple paths is larger than or equal to the threshold, operation 1107 for identifying a beam width and operation 1109 for forming a beam having the identified beam width may not be performed.

According to certain embodiments, if the number of multiple paths is less than the threshold, the electronic device 101 may identify the beam width of a beam used to search for or communicate with an external electronic device (e.g., the electronic device 102 or 104), based on the identified mobility information in operation 1107.

According to certain embodiments, the electronic device 101 may form a beam having the identified beam width in operation 1109. To form the beam having the identified beam width, the electronic device 101 may identify the number of operating antenna elements among the plurality of antenna elements included in the antenna or a power ratio among the plurality of antenna elements. The electronic device 101 may then form the beam having the identified beam width by using the identified number of operating antenna elements or the power ratio among the plurality of antenna elements.

While it has been described that a beam width corresponding to mobility information is identified and a beam having the identified beam width is formed in operations 1107 and 1109, a beamforming condition corresponding to mobility information may be identified and a beam may be formed based on the identified beamforming condition, as described before with reference to FIG. 4B.

According to certain embodiments, the electronic device 101 may search for or communicate with an external electronic device by the formed beam in operation 1111. For example, if the number of multiple paths is less than the threshold, the electronic device 101 may search for or communicate with an external electronic device by the formed beam having the beam width corresponding to the mobility information. In another example, if the number of multiple paths is larger than or equal to the threshold, the electronic device 101 may search for or communicate with an external electronic device by a beam having the default beam width or by maintaining an existing beam width.

In certain embodiments, while the electronic device 101 may be in motion, there is no relative motion between the electronic device 101 and the external electronic device. This can be the case if the electronic device 101 and the external device are on the same moving object. In such a case, while the electronic device 101 is on a fast moving object, the beam form corresponding to the fast moving object may not provide optimal results.

Figure 12A:
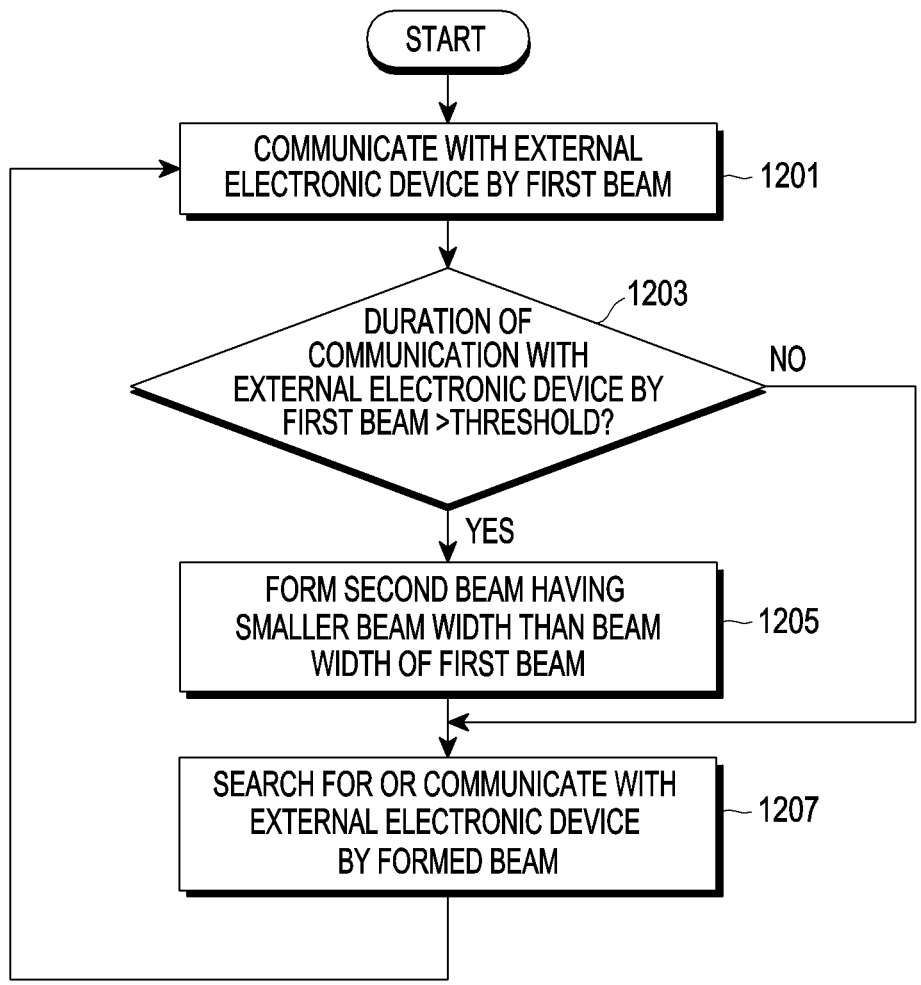
FIG. 12A and FIG. 12B are diagrams illustrating a beamforming method according to certain embodiments.
Figure 12B:
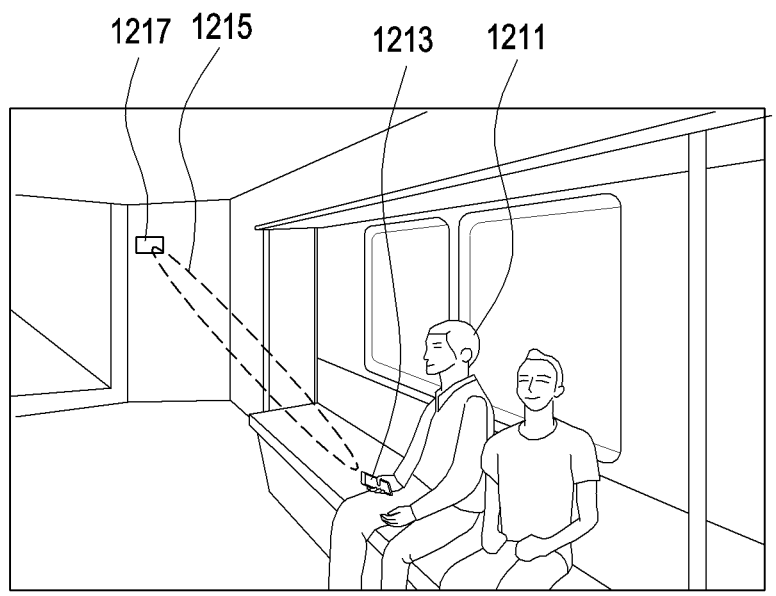

FIG. 12A and FIG. 12B are diagrams illustrating a beamforming method according to certain embodiments. The embodiment of FIG. 12A will be described with reference to FIG. 12B.

According to certain embodiments, the electronic device 101 (e.g., the processor 120) may communicate with an external electronic device (e.g., the electronic device 102 or 104) by a first beam in operation 1201. For example, as illustrated in FIG. 12B, it may be assumed that a user 1211 is riding on a fast moving object (a train/tram/subway), an external electronic device 1217 is an access point deployed in the fast moving object, and a first beam 1215 is the best beam between an electronic device 1213 and the external electronic device 1217. Further, the first beam 1215 may have a beam width identified based on mobility information indicating "riding a fast moving object".

Referring to FIG. 12A, according to certain embodiments, the electronic device 101 may determine whether the duration of communication with the external electronic device 1217 by the first beam is longer than a threshold in operation 1203. The duration of communication with the external electronic device 1217 by the first beam longer than the threshold may mean that a time period during which the first beam is maintained as the best beam is longer than the threshold.

According to certain embodiments, if the duration of communication with the external electronic device 1217 by the first beam is longer than the threshold, the electronic device 101 may form a second beam having a beam width smaller than that of the first beam in operation 1205. As illustrated in FIG. 12B, when the user 1211 is stationary, a relative speed between the electronic device 1213 and the external electronic device 1217 is 0, even though the mobility information indicates that the user is on a fast moving object. Therefore, the electronic device may not need to communicate by the beam having the beam width corresponding to "riding a fast moving object". Then, the electronic device 101 may form the second beam having the beam width smaller than that of the first beam 1215 (e.g., the beam having the beam width corresponding to riding on a fast moving object). On the other hand, if the duration of communication with the external electronic device 1217 by the second beam is longer than a threshold, the electronic device 101 may form a third beam having a beam width smaller than that of the second beam. In this manner, the operation of reducing a beam width may be repeated.

According to certain embodiments, the electronic device may search for or communicate with an external electronic device by the formed beam in operation 1207. For example, if the duration of communication with the external electronic device by the first beam is longer than the threshold, the electronic device may search for or communicate with an external electronic device by the second beam having a smaller beam width than that of the first beam. In another example, if the duration of communication with the external electronic device by the first beam is shorter than or equal to the threshold, the electronic device may search for or communicate with an external electronic device by the first beam.

Figure 13A:
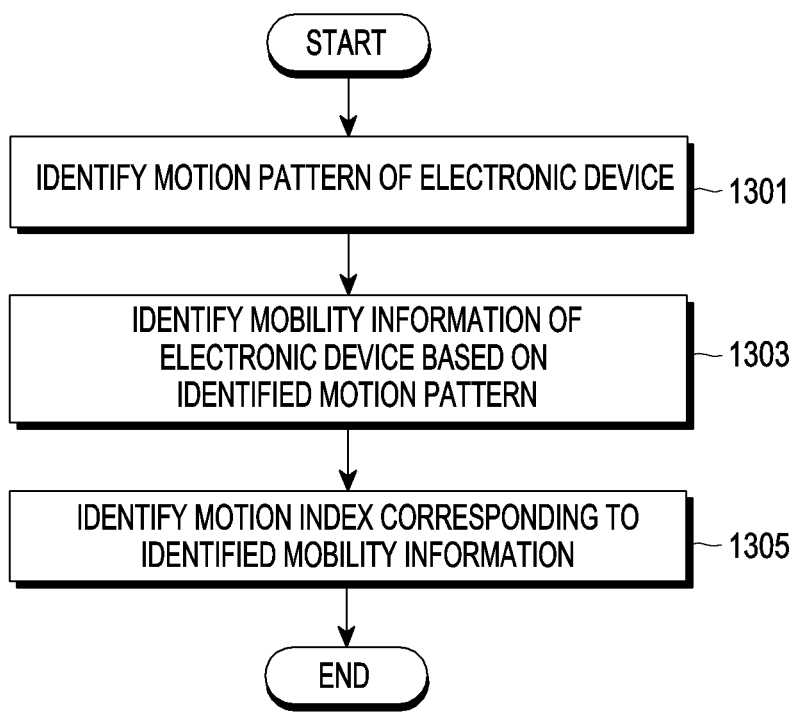
FIG. 13A and FIG. 13B are diagrams illustrating a beamforming method according to certain embodiments.
Figure 13B:
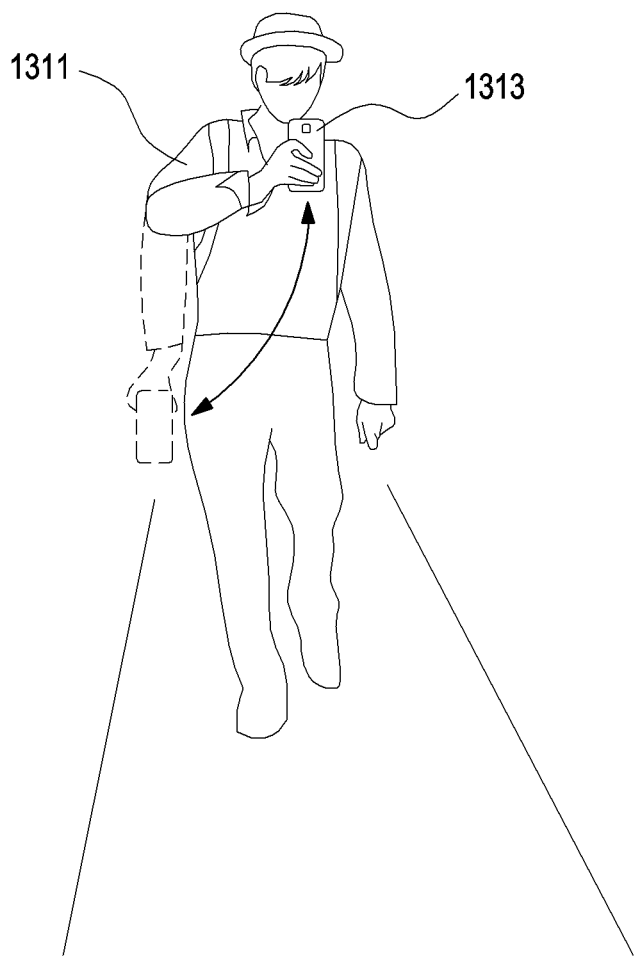

FIG. 13A and FIG. 13B are diagrams illustrating a beam-forming method according to certain embodiments. The embodiment of FIG. 13A will be described with reference to FIG. 13B.

According to certain embodiments, the electronic device 101 (e.g., the processor 120) may identify a motion pattern of the electronic device 101. For example, the motion pattern may be a pattern in which the electronic device 101 moves. For example, as illustrated in FIG. 13B, an electronic device 1313 may identify a motion pattern corresponding to a case where a user 1311 is walking and moving his or her arms back and forth while grabbing the electronic device 1313 with his or her hand or holding the electronic device 1313 in a certain direction.

Referring to FIG. 13A, according to certain embodiments, the electronic device 101 may identify mobility information of the electronic device 101 in consideration of an identified motion pattern in operation 1303. For example, as illustrated in FIG. 13B, the mobility information may be identified in consideration of the motion pattern corresponding to walking with arms moving back and forth. For example, the mobility may be identified as larger when the mobility information is identified in consideration of the motion pattern corresponding to walking with arms moving back and forth than when the mobility information is identified only in consideration of the speed of the electronic device 101.

According to certain embodiments, the electronic device 101 may identify a motion index corresponding to the identified mobility information in operation 1305. For example, the electronic device 101 may map mobility information to motion indexes and store the mapped mobility information, as illustrated in [Table 3].

TABLE 3

| Mobility information | Motion index |
| --- | --- |
| A | 0 |
| B | 1 |
| C | |
| D | |
| E | 2 |

According to certain embodiments, the electronic device 101 may include a housing, a first communication circuit (e.g., the first communication circuit 213) positioned inside the housing and configured to transmit at least one RF signal, at least one antenna structure (e.g., the antenna 222-1) positioned inside the housing or being part of the housing, electrically coupled to the first communication circuit (e.g., the first communication circuit 213), and including a plurality of antenna elements, at least one processor (e.g., the processor 120) operatively coupled to the first communication circuit (e.g., the first communication circuit 213), and a memory (e.g., the memory 130) operatively coupled to the at least one processor (e.g., the processor 120). The memory (e.g., the memory 130) may store instructions that, when executed by the processor (e.g., the processor 120), cause the processor (e.g., the processor 120) to identify mobility information of the electronic device 101, identify a beam width of a beam formed by at least a part of the plurality of antenna elements based on at least part of the mobility information of the electronic device 101, the beam being used to search for or communicate with an external electronic device (e.g., the electronic device 102 or 104), and form the beam having the identified beam width.

In certain embodiments, the housing can include a first plate, a second plate facing in an opposite direction to the first plate, and a side surface member surrounding a space between the first plate and the second plate or integrally formed.

According to certain embodiments, the electronic device 101 may further include a sensor (e.g., the sensor module 176) positioned inside the housing, and the instructions may cause the processor (e.g., the processor 120) to identify the mobility information of the electronic device 101 by using the sensor (e.g., the sensor module 176).

According to certain embodiments, the instructions may cause the processor (e.g., the processor 120) to, when the mobility information is changed, identify a beam width of a beam based on the changed mobility information, the beam being used to search for or communicate with the external electronic device (e.g., the electronic device 102 or 104).

According to certain embodiments, the instructions may cause the processor (e.g., the processor 120) to identify a number of operating antenna elements, corresponding to the identified beam width, and form the beam having the identified beam width through the identified number of antenna elements by applying the RF signal to the identified number of antenna elements by using the first communication circuit (e.g., the first communication circuit 213).

According to certain embodiments, the instructions may cause the processor (e.g., the processor 120) to compensate a power gain by automatic gain control (AGC) signal processing.

According to certain embodiments, the instructions may cause the processor (e.g., the processor 120) to, if the identified beam width is equal to or larger than a specific value, receive a communication signal in a range corresponding to the identified beam width, with a magnitude equal to or larger than a predetermined value by using a low noise amplifier (LNA).

According to certain embodiments, the electronic device 101 may further include a second communication circuit positioned inside the housing, electrically coupled to the first communication circuit (e.g., the first communication circuit 213), and configured to amplify the RF signal applied to each of the plurality of antenna elements and shift a phase of the RF signal. The instructions may cause the processor (e.g., the processor 120), as at least part of the operation of forming the beam having the identified beam width, to identify a power ratio among the antenna elements corresponding to the identified beam width and form the beam having the identified beam width through the plurality of antenna elements by amplifying the RF signal to match a ratio of power applied to the plurality of antennas to the identified power ratio by using the second communication circuit.

According to certain embodiments, the instructions may cause the processor (e.g., the processor 120), as at least part of the operation of forming the beam having the identified beam width, to identify the beam width of the beam based on at least one of a received signal strength or channel quality information of the electronic device 101 together with the identified mobility information.

According to certain embodiments, the instructions may cause the processor (e.g., the processor 120), as at least part of the operation of forming the beam having the identified beam width, to identify the beam width of the beam based on a number of path signals observed in the electronic device 101 together with the identified mobility information.

According to certain embodiments, the instructions may cause the processor (e.g., the processor 120) to, if the beam used to search for or communicate with the external electronic device (e.g., the electronic device 102 or 104) is not changed for a predetermined time, form a beam having a beam width smaller than the identified beam width.

According to certain embodiments, the instructions may cause the processor (e.g., the processor 120), as at least part of the operation of forming the beam having the identified beam width, to identify a motion pattern of the electronic device 101 and identify the mobility information based on the identified motion pattern.

According to certain embodiments, the instructions may cause the processor (e.g., the processor 120) to identify a mobility index corresponding to the mobility information of the electronic device 101 and identify the beam width of the beam based on the identified mobility index.

According to certain embodiments, a method of controlling a beam width of a beam in the electronic device 101 may include identifying mobility information of the electronic device 101, identifying a beam width of a beam formed by at least a part of a plurality of antenna elements based on the mobility information of the electronic device 101, the beam being used to search for or communicate with an external electronic device (e.g., the electronic device 102 or 104), and forming the beam having the identified beam width.

According to certain embodiments, the identification of mobility information may include identifying the mobility information of the electronic device 101 by using a sensor (e.g., the sensor module 176) positioned inside the electronic device 10.

According to certain embodiments, the identification of a beam width of a beam may include, when the mobility information is changed, identifying a beam width of a beam based on the changed mobility information, the beam being used to search for or communicate with the external electronic device (e.g., the electronic device 102 or 104).

According to certain embodiments, the formation of the beam having the identified beam width may include identifying a number of operating antenna elements corresponding to the identified beam width and forming the beam having the identified beam width through the identified number of antenna elements by applying an RF signal to the identified number of antenna elements by using the first communication circuit.

According to certain embodiments, the method may further include compensating a power gain by automatic gain control (AGC) signal processing.

According to certain embodiments, the identification of the beam width of the beam may include, if the identified beam width is equal to or larger than a specific value, receiving a communication signal in a range corresponding to the identified beam width, with a magnitude equal to or larger than a predetermined value by using a low noise amplifier (LNA).

According to certain embodiments, the formation of the beam having the identified beam width may include identifying a power ratio among the antenna elements corresponding to the identified beam width and forming the beam having the identified beam width through the plurality of antenna elements by amplifying an RF signal to match a ratio of power applied to the plurality of antennas to the identified power ratio.

According to certain embodiments, the electronic device 101 may include a housing, a first communication circuit (e.g., the first communication circuit 213) positioned inside the housing and configured to transmit at least one RF signal, at least one antenna (e.g., the antenna 222-1) positioned inside the housing or being part of the housing, electrically coupled to the first communication circuit (e.g., the first communication circuit 213), and including a plurality of antenna elements, at least one processor (e.g., the processor 120) operatively coupled to the first communication circuit (e.g., the first communication circuit 213), and a memory (e.g., the memory 130) operatively coupled to the at least one processor (e.g., the processor 120). The memory (e.g., the memory 130) may store instructions that, when executed by the processor (e.g., the processor 120), cause the processor (e.g., the processor 120) to identify mobility information of the electronic device 101, identify a condition for forming a beam formed by at least a part of the plurality of antenna elements, the beam being used to search for or communicate with an external electronic device (e.g., the electronic device 102 or 104), and form the beam based on the identified condition.

According to certain embodiments, the electronic device 101 may include a housing including a first plate, a second plate facing in an opposite direction to the first plate, and a side surface member surrounding a space between the first plate and the second plate, and coupled to the second plate or integrally formed with the second plate, a display (e.g., the display device 160) exposed through part of the first plate, an antenna structure (e.g., the antenna 222-1) positioned inside the housing and including a PCB and a plurality of antenna elements disposed on the PCB, a wireless communication processor (e.g., the first communication circuit 213) electrically coupled to the antenna elements, and configured to transmit and/or receive a signal of a frequency between 3 GHz and 100 GHz, at least one sensor operatively coupled to the wireless communication processor (e.g., the first communication circuit 213), and a memory (e.g., the memory 130) operatively coupled to the wireless communication processor (e.g., the first communication circuit 213). The memory (e.g., the memory 130) may store instructions that, when executed by the wireless communication processor (e.g., the first communication circuit 213), cause the wireless communication processor to obtain information related to a motion of the electronic device from the at least one sensor, and select antenna elements to transmit and/or receive the signal from among the antenna elements and/or determine power to be supplied to each of the antenna elements based on at least part of the information related to the motion.

As is apparent from the foregoing description, according to certain embodiments, an electronic device capable of maintaining a high radio signal quality by controlling the beam width of an electronic device beam according to mobility of the electronic device and a method thereof may be provided.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a sensor;
   a first communication circuit capable of transmitting a radio frequency (RF) signal;
   a second communication circuit operatively coupled to the first communication circuit and capable of amplifying the RF signal;
   at least one antenna, operatively coupled to the second communication circuit, and including a plurality of antenna elements;
   a communication processor operatively coupled to the first communication circuit, the second communication circuit, and the sensor;
   an application processor different from the communication processor; and
   a memory operatively coupled to the communication processor,
   wherein the memory stores instructions that, when executed by the communication processor, cause the communication processor to perform a plurality of operations comprising:
   identifying mobility information of the electronic device by using sensor information directly provided from the sensor to the communication processor;

identifying a beam width for a beam to be formed through at least a part of the plurality of antenna elements based on at least part of the mobility information, the beam being used to search for or communicate with an external electronic device;

identifying a ratio of first power to provide at least one among at least the part of the plurality of antenna elements and second power to provide at least another among at least the part of the plurality of antenna elements corresponding to the beam width; and controlling the second communication circuit to form the beam having the beam width by amplifying the RF signal based on the ratio of the first power and the second power.

2. The electronic device of claim 1, wherein the plurality of operations comprises:

when the mobility information is changed, identifying the beam width of the beam based on the changed mobility information, the beam being used to search for or communicate with the external electronic device.

3. The electronic device of claim 1, wherein the plurality of operations comprises:

identifying a number of operating antenna elements, corresponding to the beam width; and controlling the second communication circuit to form the beam having the beam width through the identified number of operating antenna elements by applying the RF signal to the identified number of antenna elements.

4. The electronic device of claim 3, wherein the plurality of operations comprises compensating a power gain by automatic gain control (AGC) signal processing.

5. The electronic device of claim 3, wherein to the plurality of operations comprises, in response to the beam width being equal to or larger than a specific value, receiving a communication signal in a range corresponding to the beam width, with a magnitude equal to or larger than a predetermined value by using a low noise amplifier (LNA).

6. The electronic device of claim 1, wherein the operation of identifying the beam width for the beam, further comprises identifying the beam width for the beam based on at least one of a received signal strength and the mobility information or channel quality information of the electronic device and the mobility information.

7. The electronic device of claim 1, wherein the operation of identifying the beam width for the beam, further comprises identifying the beam width for the beam based on a number of path signals observed in the electronic device and the mobility information.

8. The electronic device of claim 1, wherein the plurality of operations further comprises:

in response to the beam used to search for or communicate with the external electronic device being maintained for a predetermined time, controlling the second communication circuit to form another beam having another beam width smaller than the beam width.

9. The electronic device of claim 1, wherein the operation of identifying the mobility information of the electronic device, further comprises:

identifying a motion pattern of the electronic device; and identifying the mobility information based on the identified motion pattern.

10. The electronic device of claim 1, wherein the plurality of operations further comprises:

identifying a mobility index corresponding to the mobility information of the electronic device; and identifying the beam width for the beam based on the identified mobility index.

11. The electronic device of claim 1, wherein identifying the ratio comprises selecting the ratio from a plurality of ratios stored in the memory.

12. A method of controlling a beam width for a beam in an electronic device comprising a sensor; a first communication circuit capable of transmitting a radio frequency (RF) signal; a second communication circuit operatively coupled to the first communication circuit and capable of amplifying the RF signal; at least one antenna, operatively coupled to the second communication circuit, and including a plurality of antenna elements; a communication processor operatively coupled to the first communication circuit, the second communication circuit, and the sensor; and an application processor different from the communication processor, the method comprising:

identifying mobility information of the electronic device by using sensor information directly provided from the sensor to the communication processor;

identifying the beam width for the beam to be formed through at least a part of the plurality of antenna elements based on at least part of the mobility information, the beam being used to search for or communicate with an external electronic device;

identifying a ratio of first power to provide at least one among at least the part of the plurality of antenna elements and second power to provide at least another among at least the part of the plurality of antenna elements corresponding to the beam width; and controlling the second communication circuit to form the beam having the beam width by amplifying the RF signal based on the ratio of the first power and the second power.

13. The method of claim 12, wherein the identifying the beam width for the beam comprises, when the mobility information is changed, identifying the beam width for the beam based on the changed mobility information, the beam being used to search for or communicate with the external electronic device.

14. The method of claim 12, wherein the forming the beam having the beam width comprises:

identifying a number of operating antenna elements, corresponding to the beam width; and controlling the second communication circuit to form the beam having the beam width through the identified number of operating antenna elements by applying the radio frequency (RF) signal to the identified number of antenna elements.

15. The method of claim 14, further comprising compensating a power gain by automatic gain control (AGC) signal processing.

16. The method of claim 14, wherein the identifying the beam width of the beam comprises, in response to the beam width being equal to or larger than a specific value, receiving a communication signal in a range corresponding to the beam width, with a magnitude equal to or larger than a predetermined value by using a low noise amplifier (LNA).

* * * * *